US009025354B2

(12) United States Patent
Channabasappa (10) Patent No.: US 9,025,354 B2
(45) Date of Patent: May 5, 2015

(54) POWER LIMITING IN A CONTENT SEARCH SYSTEM

(71) Applicant: Broadcom Corporation, Irvine, CA (US)

(72) Inventor: Shankar Channabasappa, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/915,211

(22) Filed: Jun. 11, 2013

(65) Prior Publication Data

US 2013/0279231 A1     Oct. 24, 2013

Related U.S. Application Data

(63) Continuation of application No. 13/069,220, filed on Mar. 22, 2011, now Pat. No. 8,467,213.

(51) Int. Cl.
*G11C 15/00* (2006.01)
*G11C 15/04* (2006.01)
*G11C 5/14* (2006.01)
*G06F 1/32* (2006.01)

(52) U.S. Cl.
CPC ........ *G11C 15/04* (2013.01); *G11C 5/14* (2013.01); *G11C 15/00* (2013.01); *G06F 1/3275* (2013.01); *Y02B 60/1225* (2013.01)

(58) Field of Classification Search
USPC ........................................... 365/49.17
See application file for complete search history.

(56) References Cited

U.S. PATENT DOCUMENTS

| 4,244,033 A | 1/1981 | Hattori |
| 4,656,626 A | 4/1987 | Yudichak et al. |
| 4,670,858 A | 6/1987 | Almy |
| 4,813,002 A | 3/1989 | Joyce et al. |

(Continued)

FOREIGN PATENT DOCUMENTS

| CN | 1702773 A | 11/2005 |
| CN | 101189674 A | 5/2008 |

(Continued)

OTHER PUBLICATIONS

U.S. Appl. No. 13/034,570, filed Feb. 24, 2011, Shankar Channabasappa.

(Continued)

*Primary Examiner* — Hoai V Ho
(74) *Attorney, Agent, or Firm* — Sterne, Kessler, Goldstein & Fox PLLC (57) ABSTRACT

A content search system including a CAM device having a plurality of CAM blocks and a governor logic receives a search request and compares the number of CAM blocks required to perform the requested search to a limit number, the limit number being the maximum number of CAM blocks permitted to be used in a requested search operation. If the number of CAM blocks required to perform the requested search exceeds the maximum number of CAM blocks permitted to be used in a requested search operation, then the search operation is rejected. The governing operation can be performed on each requested search, thus limiting power dissipation. The relationship between a maximum number of CAM blocks and power dissipation can be characterized, and a corresponding block limit value can be stored into a memory accessible by governor logic.

20 Claims, 8 Drawing Sheets

(56) References Cited

U.S. PATENT DOCUMENTS

| | | |
|---|---|---|
| 4,845,668 A | 7/1989 | Sano et al. |
| 4,888,731 A | 12/1989 | Chuang et al. |
| 4,958,377 A | 9/1990 | Takahashi |
| 4,959,811 A | 9/1990 | Szczepanek |
| 4,996,666 A | 2/1991 | Duluk, Jr. |
| 5,053,991 A | 10/1991 | Burrows |
| 5,123,105 A | 6/1992 | Wyland et al. |
| 5,319,589 A | 6/1994 | Yamagata et al. |
| 5,383,146 A | 1/1995 | Threewitt |
| 5,388,066 A | 2/1995 | Hamamoto et al. |
| 5,440,715 A | 8/1995 | Wyland |
| 5,440,753 A | 8/1995 | Hou et al. |
| 5,448,733 A | 9/1995 | Satoh et al. |
| 5,485,418 A | 1/1996 | Hiraki et al. |
| 5,513,134 A | 4/1996 | Cooperman et al. |
| 5,524,231 A | 6/1996 | Brown |
| 5,555,397 A | 9/1996 | Sasama et al. |
| 5,642,322 A | 6/1997 | Yoneda |
| 5,649,149 A | 7/1997 | Stormon et al. |
| 5,706,224 A | 1/1998 | Srinivasan et al. |
| 5,726,942 A | 3/1998 | Yoneda et al. |
| 5,818,786 A | 10/1998 | Yoneda |
| 5,828,593 A | 10/1998 | Schultz et al. |
| 5,860,085 A | 1/1999 | Starman et al. |
| 5,870,324 A | 2/1999 | Helwig et al. |
| 5,920,886 A | 7/1999 | Feldmeier |
| 5,946,704 A | 8/1999 | Yoneda et al. |
| 5,999,435 A | 12/1999 | Henderson et al. |
| 6,044,005 A | 3/2000 | Gibson et al. |
| 6,081,442 A | 6/2000 | Igarashi et al. |
| 6,125,049 A | 9/2000 | Nataraj |
| 6,147,891 A | 11/2000 | Nataraj |
| 6,166,939 A | 12/2000 | Nataraj et al. |
| 6,191,969 B1 | 2/2001 | Pereira |
| 6,191,970 B1 | 2/2001 | Pereira |
| 6,195,278 B1 | 2/2001 | Galin et al. |
| 6,243,280 B1 | 6/2001 | Wong et al. |
| 6,275,426 B1 | 8/2001 | Srinivasan et al. |
| 6,324,087 B1 | 11/2001 | Pereira |
| 6,430,074 B1 | 8/2002 | Srinivasan |
| 6,487,131 B1 | 11/2002 | Clark et al. |
| 6,538,911 B1 | 3/2003 | Allan et al. |
| 6,687,785 B1 | 2/2004 | Pereira |
| 6,697,276 B1 | 2/2004 | Pereira et al. |
| 6,744,652 B2 | 6/2004 | Srinivasan et al. |
| 6,760,242 B1 | 7/2004 | Park et al. |
| 6,763,425 B1 | 7/2004 | Pereira |
| 6,768,659 B2 | 7/2004 | Gillingham et al. |
| 6,804,133 B1 | 10/2004 | Khanna |
| 6,804,134 B1 | 10/2004 | Proebstiing et al. |
| 6,829,153 B1 | 12/2004 | Park et al. |
| 6,867,991 B1 | 3/2005 | Tezcan et al. |
| 6,934,795 B2 | 8/2005 | Nataraj et al. |
| 6,944,709 B2 | 9/2005 | Nataraj et al. |
| 6,965,519 B1 | 11/2005 | Park et al. |
| 6,967,856 B1 | 11/2005 | Park et al. |
| 6,972,978 B1 | 12/2005 | Miller et al. |
| 7,043,601 B2 | 5/2006 | McKenzie et al. |
| 7,050,318 B1 | 5/2006 | Argyres |
| 7,096,318 B2 | 8/2006 | Jalowiecki et al. |
| 7,113,415 B1 | 9/2006 | Khanna |
| 7,184,235 B2 | 2/2007 | Jensen |
| 7,185,141 B1 | 2/2007 | James et al. |
| 7,193,874 B1 | 3/2007 | Pereira et al. |
| 7,219,188 B1 | 5/2007 | Pereira |
| 7,251,707 B1 | 7/2007 | Pereira |
| 7,260,674 B2 | 8/2007 | Mukherjee |
| 7,262,586 B1 | 8/2007 | Gradinariu |
| 7,277,983 B1 * | 10/2007 | Om .............................. 711/108 |
| 7,325,091 B2 | 1/2008 | Pereira |
| 7,346,000 B1 | 3/2008 | Srinivasan et al. |
| 7,694,068 B1 | 4/2010 | Rosman |
| 7,800,930 B1 | 9/2010 | Deshpande et al. |
| 7,848,129 B1 | 12/2010 | Deshpande et al. |
| 7,852,652 B1 | 12/2010 | Fabry |
| 7,920,399 B1 | 4/2011 | Nataraj et al. |
| 8,031,501 B1 | 10/2011 | Nataraj et al. |
| 8,031,503 B1 | 10/2011 | Gyllenhammer et al. |
| 8,467,213 B1 | 6/2013 | Channabasappa |
| 2005/0063241 A1 * | 3/2005 | Pereira et al. ................ 365/222 |
| 2006/0203529 A1 * | 9/2006 | Radke ............................ 365/49 |

FOREIGN PATENT DOCUMENTS

| | | |
|---|---|---|
| EP | 0 381 249 | 8/1990 |
| EP | 0 774 758 | 6/1998 |
| EP | 0 872 802 | 10/1998 |
| EP | 0 918 335 | 8/1999 |
| EP | 1 713 082 | 10/2006 |
| JP | 6-333395 A | 12/1994 |
| JP | 07 021785 | 1/1995 |
| JP | 08 273376 | 10/1996 |

OTHER PUBLICATIONS

U.S. Appl. No. 13/226,220, filed Sep. 6, 2011, Cristian Estan.
U.S. Appl. No. 13/226,237, filed Sep. 6, 2011, Cristian Estan.
EPO Search Report dated Feb. 12, 2002 for PCT Application No. PCT/US01/18736, 7 pages.
Echeverria, J. et al., "A Banked Precomputation-Based CAM Architecture for Low-Power Storage-Demanding Applications," *IEEE MELECON 2006*, Benalmadena (Malaga), Spain, pp. 57-60 (May 16-10, 2006).
European Search Report, for EP Appl. No. 12001681.1, dated Jul. 11, 2012, 3 pages.
English Abstract for Japanese Patent Publication No. JP 6-333395 A, published Dec. 2, 1994, 1 page.
Office Action for Chinese Patent Application No. 201210079271.1, mailed on Jun. 4, 2014.
Office Action for Chinese Patent Application No. 201210079271.1, mailed on Feb. 4, 2015.

* cited by examiner

POWER LIMITING IN A CONTENT SEARCH SYSTEM

CROSS-REFERENCE TO RELATED APPLICATIONS

This application is a continuation of U.S. patent application Ser. No. 13/069,220, filed Mar. 22, 2011, which will issue as U.S. Pat. No. 8,467,213 on Jun. 18, 2013, all of which is incorporated by reference herein in its entirety.

TECHNICAL FIELD

This disclosure relates generally to content search systems and specifically to power limiting techniques for content addressable memories.

DESCRIPTION OF RELATED ART

Content addressable memory (CAM) devices are frequently used in network switching and routing applications to determine forwarding destinations, to perform classification functions, to implement Quality of Service (QoS) functions, and other tasks associated with routing data packets across a network. For example, routers used by local Internet Service Providers (ISPs) typically include one or more CAM devices for storing a plurality of Internet addresses and associated data such as, for instance, corresponding address routing information. When a data packet is routed to a destination address, the destination address is provided as a search key to the CAM device and then compared with all CAM words (e.g., Internet addresses) stored in the CAM array. If there is a match between the search key and data stored in the CAM array, match information corresponding to the matching CAM word is output and thereafter used to route the data.

More specifically, a CAM device includes a CAM array having a plurality of CAM cells organized in a number of rows and columns. Each row of CAM cells, which can be used to store a CAM word, is coupled to a corresponding match line that indicates match results for the row. Each column of CAM cells is typically coupled to one or more data lines or data line pairs that can be used to drive data into a selected CAM row during write operations and/or for providing a search key to the CAM rows during compare operations. During a compare operation, the search key (e.g., the comparand word) is provided to the CAM array and compared with the CAM words stored therein. For each CAM word that matches the search key, a corresponding match line is asserted to indicate the match condition, and a priority encoder determines the match address or index of the highest priority matching (HPM) entry in the CAM array.

Power consumption associated with performing search operations in a CAM device is related to the total size (e.g. rows) of each CAM array block, the number of CAM blocks in the CAM device, and other factors. For example, precharging all the match lines prior to the compare operation and then discharging the match lines associated with CAM rows that do not indicate a match condition consumes a significant amount of power, as does driving the search key into each CAM block for the compare operation.

Advances in CAM architectures and semiconductor process technologies have significantly increased storage density and data throughput. However, as storage density and data throughput increase, so do power consumption and heat generation. Indeed, thermal constraints have emerged as a potentially limiting factor in achieving even greater storage densities and data speeds. In networking environments, numerous factors such as packet size, packet content, and characteristics of compare operations can impact the performance and power consumption of CAM devices deployed therein.

To avoid spikes in power consumption that can damage network components (e.g., due to overheating), network architects typically specify the maximum power consumption of various components selected for deployment in the network. As a result, manufacturers of networking components such as CAM devices are typically required to ensure that their components will not exceed the power consumption limits specified by the network architects. Because different network architectures may have various specified power consumption limits for CAM devices to be deployed therein, it is often difficult for a manufacturer of a CAM device to simultaneously satisfy various power consumption limits specified by different network customers without building a variety of CAM devices having different power limits.

Thus, there is a need for a single CAM device that can meet different power consumption limits specified by various different network customers.

BRIEF DESCRIPTION OF THE DRAWINGS

The present embodiments are illustrated by way of example and are not intended to be limited by the figures of the accompanying drawings.

Like reference numerals refer to corresponding parts throughout the drawing figures.

DETAILED DESCRIPTION

Embodiments of the present disclosure are discussed below in the context of a content search system 100 for illustrative purposes only. It is to be understood that present embodiments are equally applicable to other content search systems and/or CAM structures having other configurations of any suitable type of CAM cells. Further, architectural configurations of the present disclosure may be implemented in other types of memory blocks such as, for instance, RAM, Flash memory, and EEPROM. The interconnection between circuit elements or blocks may be shown as buses or as single signal lines, where each of the buses may alternatively be a single signal line, and each of the single signal lines may alternatively be a bus. In addition, the logic levels assigned to various signals in the description below are arbitrary, and therefore may be modified (e.g. reversed polarity) as desired. Accordingly, the embodiments described herein are not to be construed as limited to specific examples described herein but rather includes within its scope all embodiments defined by the appended claims.

A content search system is disclosed that includes a CAM device having a plurality of CAM blocks and includes governor logic that can be configured to maintain power consumption of the content search system below a specified power limit during search operations performed therein. In operation, the search system receives a search request that includes a search key and a search profile ID. The search profile ID indicates which of the CAM blocks are requested for a search operation with the search key, and thus also indicates the total number of CAM blocks requested for the search operation. The governor logic accesses a configuration memory to retrieve a block limit value indicating a maximum number of the CAM blocks that can be concurrently searched without exceeding the specified power limit, and then compares the requested number of CAM blocks with the block limit value to generate a search enable signal that selectively allows the search operation to be performed in the search system. More specifically, if the requested number of CAM blocks is less than or equal to the block limit value, the governor logic asserts the search enable signal to allow the search operation to be performed in the requested CAM blocks. For some embodiments, a search profile identified by the profile ID is used to generate block enable signals that enable the CAM blocks requested by the search request and that disable all other (e.g., non-requested) CAM blocks, thereby ensuring that only the requested CAM blocks are enabled for the search operation so that the specified power limit is not exceeded. Conversely, if the requested number of CAM blocks is greater than the block limit value, the governor logic de-asserts the search enable signal to prevent the search operation from being performed in any of the CAM blocks (e.g., because allowing the search operation to proceed would result in the specified power limit being exceeded). In this manner, present embodiments ensure that the content search system does not exceed the specified power limit.

For some embodiments, the specified power limit can be provided by a customer to the manufacturer of the content search system, and a relationship between the number of CAM blocks concurrently searched and power consumption can be characterized (e.g., during simulation and/or testing of the search system). Using this characterization, the maximum number of CAM blocks that can be concurrently searched without exceeding the specified power limit can determined and stored as the block limit value in the configuration memory. In this manner, the content search system can be configured differently to meet various specified power limits provided by customers for different applications (e.g., by storing different block limit values in the configuration memory). For example, if a first customer indicates that the power consumption of the search system cannot exceed 10 watts, then the manufacturer can limit the number of CAM blocks that can be requested for a search operation to a corresponding number (e.g., an integer value X), while if a second customer indicates that the power consumption of the search system cannot exceed 20 watts, then the manufacturer can limit the number of CAM blocks that can be requested for a search operation to a corresponding higher number (e.g., an integer value Y>X), and so on.

For one embodiment, the governor logic can include an input to receive a configuration override signal that causes the governor logic to allow all search requests, even those that would exceed the specified power limit. This allows the customer to dynamically override predetermined power limit constraints, for example, if the application requirements change subsequent to deployment of the content search systems.

Figure 1:
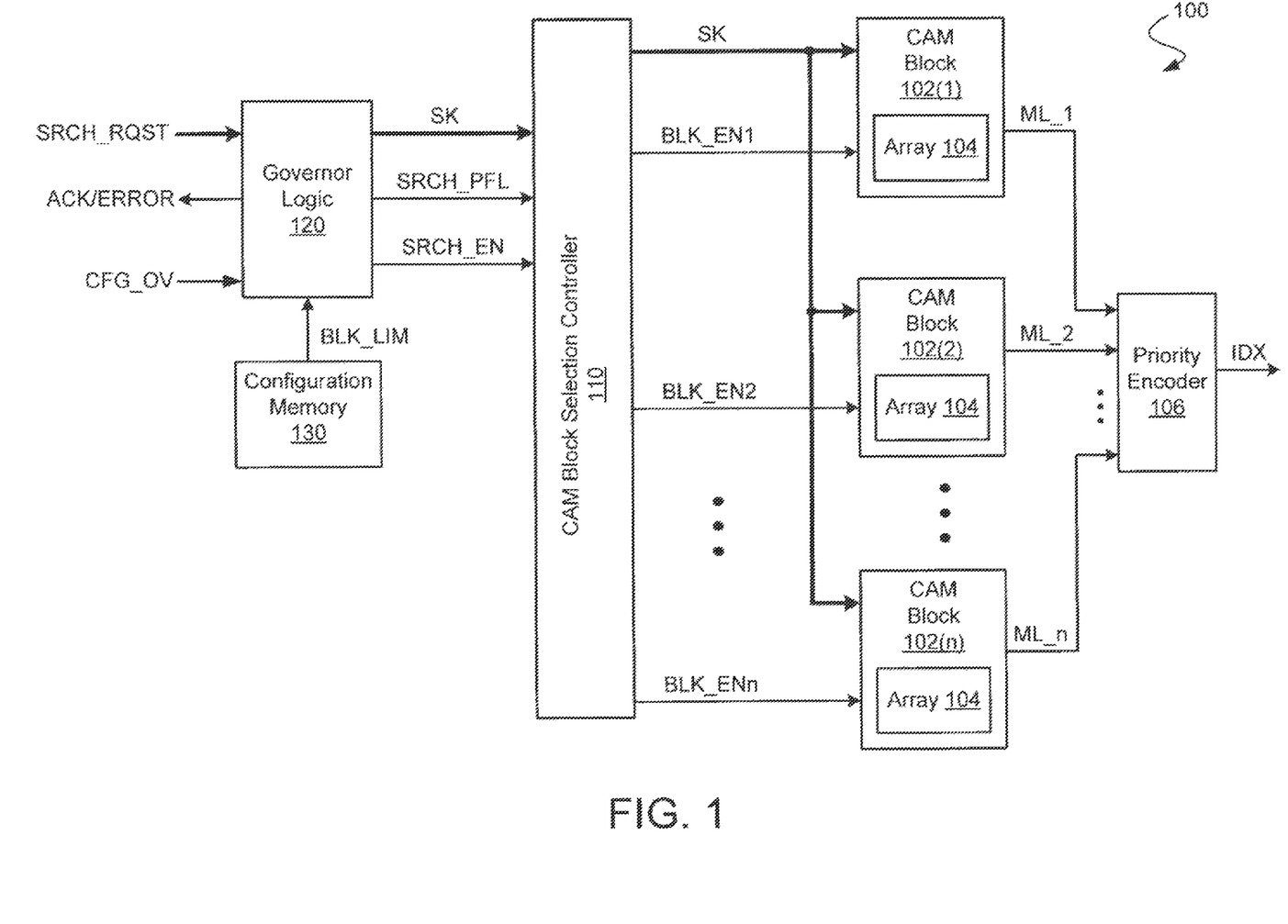
FIG. 1 shows a content search system including a CAM device configured in accordance with some of the present embodiments.

FIG. 1 shows a content search system 100 in accordance with some embodiments. The system 100 is shown to include a plurality of content addressable memory (CAM) blocks 102(1)-102(n), a priority encoder 106, a CAM block selection controller 110, governor logic 120, and a configuration memory 130. Together, the governor logic 120 and block selection controller 110 selectively allow search operations to be performed in a requested set of the CAM blocks 102 if the requested search operation is determined to fall within a specified power limit.

Each CAM block 102 includes a CAM array 104 having a plurality of rows of CAM cells (not shown in FIG. 1 for simplicity) for storing searchable data therein. Each row of CAM cells can also include one or more valid bits indicative of whether valid data is stored in the row. The valid bits can be used in a well-known manner to generate a full flag for CAM block 102. CAM blocks 102 can be any suitable type of CAM block including, for example, synchronous or asynchronous, and the CAM cells can be any suitable type of CAM cells including, for example, binary, ternary, and/or quaternary CAM cells. Further, each CAM block 102 can be any suitable size, and in some embodiments CAM blocks 102(1)-102(n) can be of different sizes. In one embodiment, each CAM block 102 includes 1 k (1024) rows of CAM cells.

Other signals provided to content search system 100 during the compare operation can be clock signals (not shown for simplicity), one or more instructions from an instruction decoder (not shown for simplicity), and other control signals. In some embodiments, instructions and comparand data can be provided to the CAM blocks 102(1)-102(n) via the same bus. Other well-known signals that can be provided to the CAM blocks 102, such as word enable signals, reset signals, and enable signals, are not shown for simplicity.

During a search operation (e.g. a compare operation), each CAM block 102 selectively receives a search key (SK) that can be compared with data stored in the rows of the block's CAM array 104. In response thereto, the CAM blocks 102(1)-102(n) enabled for the search operation provide match results to priority encoder 106 via corresponding sets of match lines ML_1 to ML_n. For simplicity, the plurality of match lines ML from each CAM block 102 are represented collectively in FIG. 1. The priority encoder 106 uses the match results provided by the enabled CAM blocks to generate an index corresponding to one of the matching CAM words in the device 100. In one embodiment, the priority encoder 106 outputs the index (IDX) of the highest priority match (HPM). The highest priority match can be the lowest numbered address, the highest numbered address, or any other selected address.

For purposes of discussion herein, the first CAM block 102(1) in the device 100 is designated as the highest priority block, the second CAM block 102(2) is designated as the next highest priority block, and so on, and the last CAM block 102(n) is designated as the lowest priority block, although in actual embodiments priority can be reversed or otherwise modified. Thus, the highest priority CAM block 102(1) can include the lowest CAM addresses (i.e. CAM addresses 0 to k−1), the next highest priority CAM block 102(2) can include the next lowest CAM addresses (i.e. CAM addresses k to 2k−1), and so on, and the lowest priority CAM block 102(n) can include the highest CAM addresses (i.e. CAM addresses (n−1)k to nk−1).

Configuration memory 130 stores a block limit value (BLK_LIM) indicating a maximum number of the CAM blocks 102 that can be concurrently searched without exceeding the specified power limit. As mentioned above, for some embodiments, the specified power limit can be provided by a customer to the manufacturer of the content search system 100, and a relationship between the number of CAM blocks concurrently searched and the associated power consumption can be used to determine the maximum number of CAM blocks that can be concurrently searched without exceeding the specified power limit. For some embodiments, the block limit value for a corresponding specified power limit can be determined during simulation and/or testing of the system 100, and then stored in the configuration memory 130 prior to delivery of search system 100 to the customer. For other embodiments, the customer can program a suitable block limit value into configuration memory 130.

The configuration memory 130 can be any suitable type of storage element. For some embodiments, configuration memory 130 is a read-only non-volatile memory element such as, for example, a ROM, PROM, and/or a fuse bank. For other embodiments, configuration memory 130 can be formed using other non-volatile memories such as, for example, EEPROM and Flash memory elements. For embodiments in which configuration memory 130 is implemented using fuses, an array of fuses can be provided in the same package as content search system 100. Programming the fuses (i.e. 'burning' the fuse to produce or associate a logic '1' or a logic '0' with the fuse) can be performed by a software program or other instructions to 'burn' the fuse bits.

Governor logic 120 includes a first input to receive a search request (SRCH RST) from a network interface or network processor (not shown for simplicity), a second input to receive the block limit value (BLK_LIM) from configuration memory 130, and outputs to provide the search key (SK), a search profile (SRCH_PFL), and/or a search enable signal (SRCH_EN) to the CAM block selection controller 110. Governor logic 120 also includes another output to generate an acknowledgement/error (ACK/ERROR) signal that can be provided back to the network interface or network processor. For other embodiments, the search key can be provided directly from the governor logic to the CAM blocks 102.

The search request includes a search key (SK) and a profile ID. The profile ID indicates which of the CAM blocks 102(1)-102(n) are requested for a corresponding search operation between the search key and data stored in the requested CAM blocks 102. The governor logic 120 compares the number of requested CAM blocks, as indicated by the profile ID, to the maximum number of CAM blocks 102 that can be concurrently searched without exceeding the specified power limit, as indicated by BLK_LIM. If the requested number of CAM blocks 102 is less than or equal to the block limit value, then governor logic 120 asserts the search enable signal (SRCH_EN), and provides a search profile (SRCH_PFL) identified by the profile ID to the CAM block selection controller 110. In response thereto, the block selection controller 110 asserts (e.g., to logic high) the block enable signals (BLK_EN) associated with the requested CAM blocks 102 to enable the requested CAM blocks 102 to compare the search key with data stored therein, and de-asserts (e.g., to logic low) the block enable signals (BLK_EN) associated with the other CAM blocks 102 to disable the non-requested CAM blocks 102 from participating in the search operation (e.g., so that the non-requested CAM blocks 102 do not consume power during the search operation). The governor logic 120 also asserts the ACK signal to alert the requester (e.g., the network interface or network processor) that the requested search operation is allowed to proceed in the requested CAM blocks 102.

Conversely, if the requested number of CAM blocks 102 is greater than the block limit value, then governor logic 120 de-asserts the search enable signal (SRCH_EN), and asserts the ERROR signal to alert the requester (e.g., the network interface or network processor) that the requested search operation is rejected because it would exceed the specified power limit. In response to the de-asserted state of SRCH_EN, the block selection controller 110 de-asserts (e.g., to logic low) all of the block enable signals (BLK_EN) to disable all CAM blocks 102(1)-102(n) so that no search operation is performed in the CAM blocks 102 (and thus little, if any, power is consumed by the CAM blocks 102).

Further, for the exemplary embodiment depicted in FIG. 1, governor logic 120 includes a third input to receive a configuration override signal (CFG_OV), and can be configured to allow all search requests to be performed in the system 100, regardless of whether the associated search operation exceeds the specified power limit, if CFG_OV is asserted (e.g., to logic high). This allows the customer to dynamically override power limit constraints if the application requirements change subsequent to deployment of the content search system. Conversely, if CFG_OV is de-asserted (e.g., to logic low), then governor logic 120 allows a requested search operation to be performed in the system 100 only if the requested search operation does not exceed the specified power limit. For other embodiments, the configuration override signal (CFG_OV) can be omitted.

Some exemplary search request scenarios of the content search system are summarized below in Table 1.

TABLE 1

| Case | CFG_OV | Indication from Search Request | BLK LIM | Enabled Blocks | Ack/ Error |
|---|---|---|---|---|---|
| 1 | Not asserted | Requests blocks 1-3 | 3 | 1, 2, 3 | ACK |
| 2 | Not asserted | Requests blocks 1-4 | 3 | None | Error |
| 3 | Not asserted | Requests blocks 1 and 3 | 3 | 1, 3 | ACK |
| 4 | Asserted | Requests blocks 1-5 | n/a | 1, 2, 3, 4, 5 | ACK |

For example, in Cases 1-3, BLK_LIM=3 to limit the number of concurrently searched CAM blocks 102 to a maximum of three, and the override signal CFG_OV is de-asserted to allow the governor logic 120 to maintain the power consumption of the CAM blocks 102 below the specified power limit. More specifically, for Case 1, three CAM blocks 102(1)-102(3) are requested, which is equal to BLK_LIM=3. Thus, the governor logic 120 asserts SRCH_EN and ACK, and the block selection controller 110 asserts BLK_EN1, BLK_EN2, and BLK_EN3 to enable the requested CAM blocks 102(1)-102(3) for the requested search operation. The block selection controller 110 de-asserts BLK_EN4 to BLK_ENn to disable the non-requested CAM blocks 102(4)-102(n) from participating in the requested search operation.

For Case 2, four CAM blocks 102(1)-102(4) are requested, which is greater than BLK_LIM=3. Thus, the governor logic 120 de-asserts SRCH_EN and asserts the ERROR signal. In response to the de-asserted state of SRCH_EN, the block selection controller 110 de-asserts all block enable signals BLK_EN1 to BLK_ENn to disable all CAM blocks 102(1)-102(n) from participating in the requested search operation.

For Case 3, two CAM blocks 102(1) and 102(3) are requested, which is less than BLK_LIM=3. Thus, the governor logic 120 asserts SRCH_EN and ACK, and the block selection controller 110 asserts BLK_EN1 and BLK_EN3 to enable the requested CAM blocks 102(1) and 102(3) for the requested search operation. The block selection controller 110 de-asserts BLK_EN2 and BLK_EN4 to BLK_ENn to disable the non-requested CAM blocks 102(2) and 102(4)-102(n) from participating in the requested search operation.

For Case 4, five CAM blocks 102(1)-102(5) are requested, and the override signal CFG_OV is asserted to override the block limit constraint. In response thereto, governor logic 120 asserts SRCH_EN and ACK, and the block selection controller 110 asserts BLK_EN1 to BLK_EN5 to enable the requested CAM blocks 102(1)-102(5) for the requested search operation. The block selection controller 110 de-asserts BLK_EN6 to BLK_ENn to disable the non-requested CAM blocks 102(6)-102(n) from participating in the requested search operation.

Thus, in this manner, governor logic 120 not only restricts search operations to data in the requested CAM block(s), but also limits power consumption by not performing search operations that would require more than the maximum number of CAM blocks 102 associated with the specified power limit. Limiting power consumption during search operations is particularly useful in applications where power consumption is a concern.

Content search system 100 can be configured in accordance with any one or more requirements as may be specified for a particular purpose (e.g. a particular commercial purpose). For example, one exemplary content search system offers 40 Mbit of TCAM storage, and supports four parallel compares simultaneously. Each of these parallel compares can be 80-bit, 160-bit, 320-bit, or 640-bit. Thus, up to 1.6 billion searches can be performed per second using a 400 MHz core clock. In one embodiment, the 40 Mbit of TCAM storage is organized as 128 1K×320 blocks of TCAM bits (e.g. CAM array 104). In another embodiment, the 40 Mbit of TCAM storage is organized as 128 2K×160 blocks of TCAM bits. In a further embodiment, the 40 Mbit of TCAM storage is organized as 128 4K×80 blocks of TCAM bits.

As described above, content search system 100 can be configured in response to the search request to selectively enable or disable CAM blocks 102 to allow search operations to use only a subset of the CAM blocks to participate in search operations. The ability to selectively enable or disable one or more CAM blocks 102 from participating in search operations may be especially useful for creating specific product configurations based on a single device, and/or for disabling defective blocks to avoid deeming the entire content search system as defective when in fact only some of the CAM blocks are defective. Such selective block enabling and disabling can be combined for creating specific product configurations based on combining defective block lists with block limits. For example, in one embodiment, a content search system with 128 CAM blocks, 8 of which are deemed defective, can be used in a limited configuration having (at most) 120 (i.e. 128 less 8) enabled CAM blocks.

Figure 2:
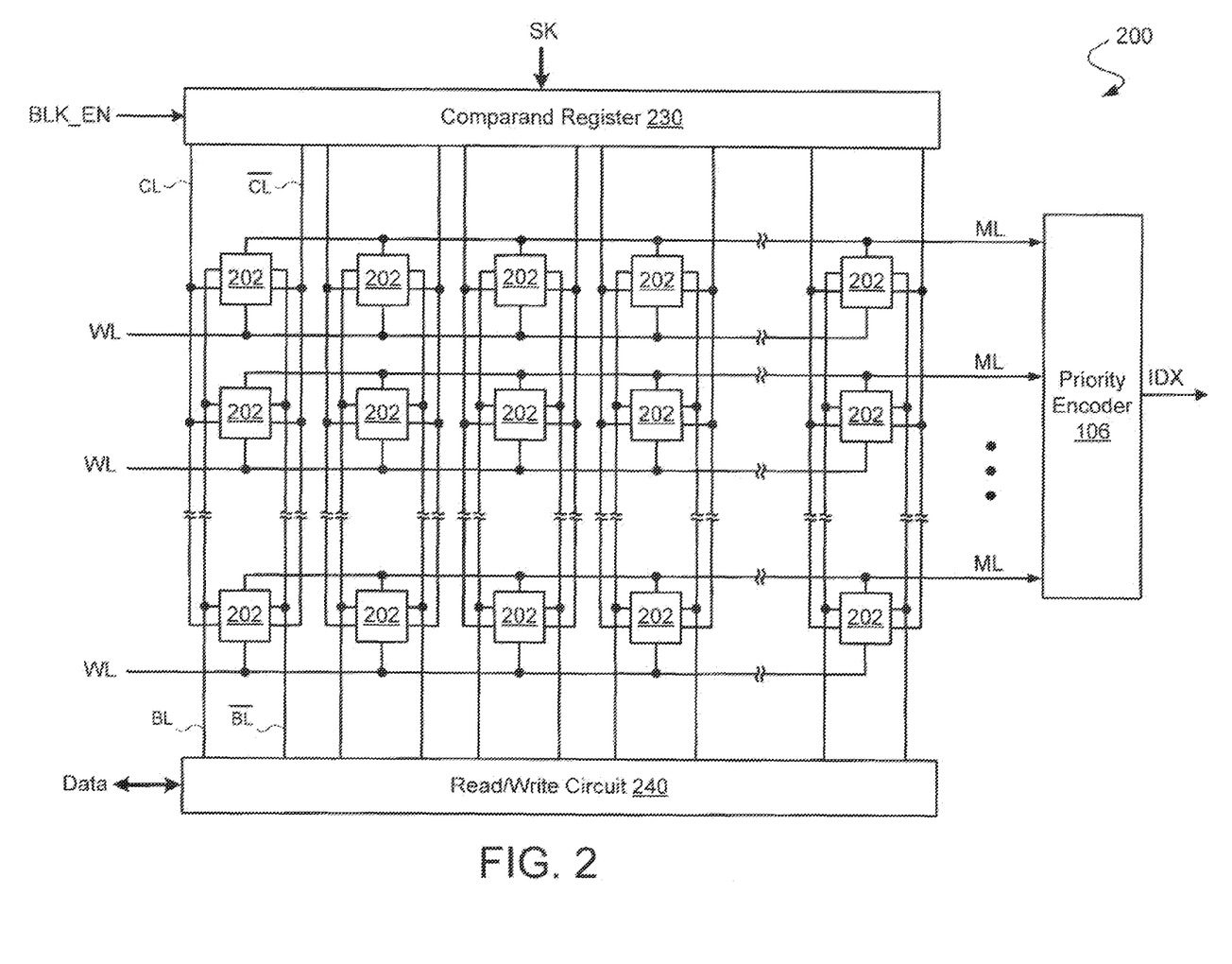
FIG. 2 is a block diagram of a CAM block in accordance with some embodiments.

FIG. 2 shows an exemplary CAM array block 200 that is one embodiment of CAM array 104 of FIG. 1. The CAM array 200 includes a plurality of CAM cells 202 organized in any number of rows and columns. Each row of CAM cells 202 is coupled to a match line ML and a word line WL. Each word line WL is driven by an address decoder (not shown) to select one or more of CAM cells 202 for writing or reading. For alternative embodiments, multiple CAM blocks can share the same address decoder. Each match line ML provides the match results of a compare operation to the priority encoder 106. A match line ML indicates a match condition for the row only if all of the CAM cells 202 in that row match the search key. Each CAM cell 202 can be a binary, ternary, quaternary, SRAM-based, or DRAM-based CAM cell. In some embodiments, the match line ML is pre-charged for the compare operation. For such embodiments, if any CAM cell 202 in the row does not match the search key, the CAM cell(s) 202 discharge the match line ML toward ground potential (e.g. logic low) to indicate the mismatch condition. Conversely, if all of the CAM cells 202 in the row match the search key, the match line ML remains in a charged state (e.g. logic high) to indicate the match condition.

The comparand register 230 also includes an input to receive a corresponding block enable signal (BLK_EN) generated by the CAM block selection controller 110 (see also FIG. 1). To disable a CAM block 102 containing array 200, BLK_EN is de-asserted (e.g., to logic low) to turn off driver circuits (not shown for simplicity) within the comparand register 230, thereby preventing the search key from being driven into array 200 and saving power consumption associated with driving the search key into CAM array 200. Further, the de-asserted state of BLK_EN can also be used to prevent the match lines ML of CAM array 200 from being pre-charged and/or discharged, thereby saving power consumption associated with charging the match lines ML. To enable the CAM block 102 containing array 200, BLK_EN is asserted (e.g., to logic high) to turn on driver circuits (not shown for simplicity) within the comparand register 230, thereby allowing the search key to be driven into array 200 and compared within data stored therein to generate match results on the match lines ML.

In alternate embodiments, other CAM array architectures can be used. For example, in some embodiments, CAM array 200 may not include complementary comparand lines CL, in which case the complementary bit lines (i.e. BL and its complement) can be coupled to the comparand drivers (not shown) and used to perform a compare operation as is generally known in the art.

Figure 3A:
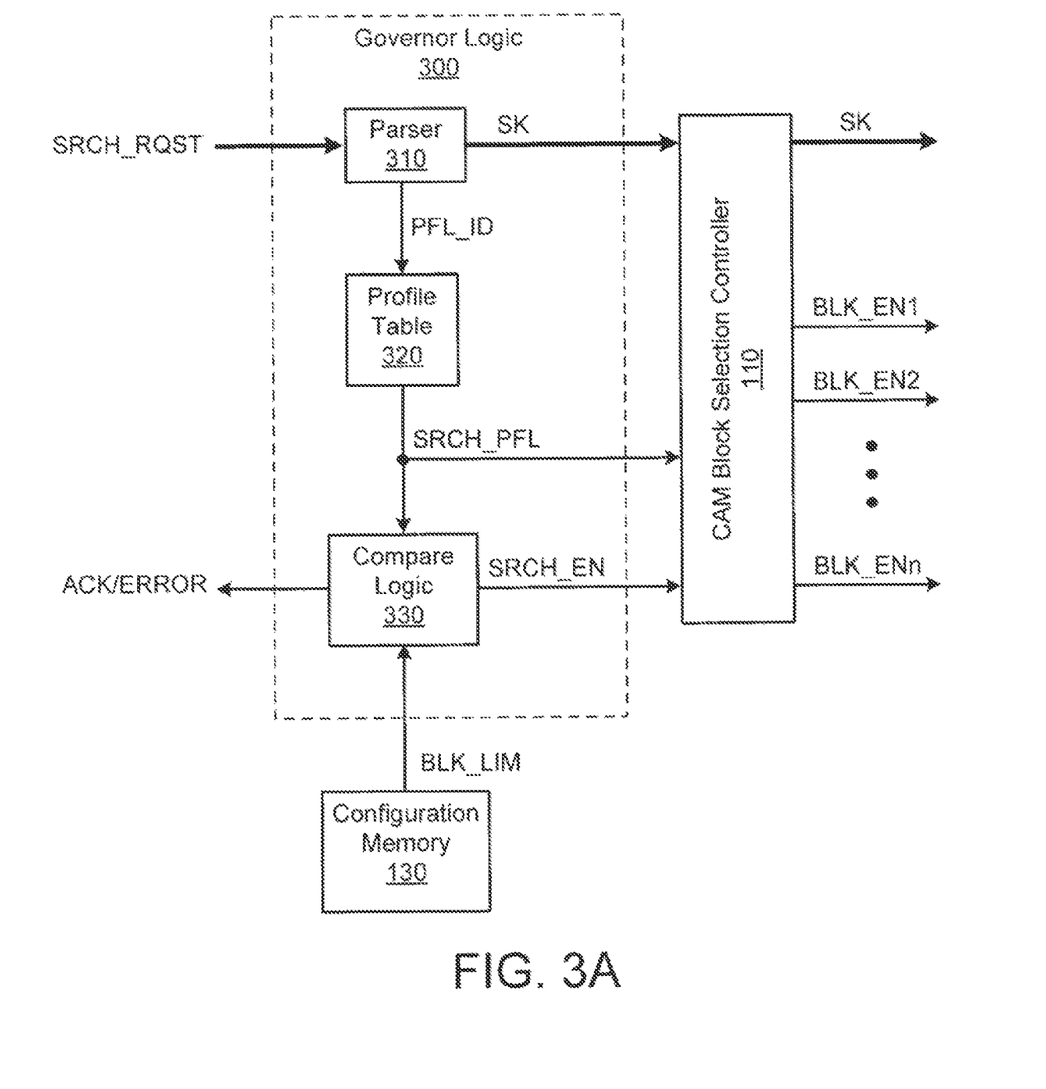
FIG. 3A is a block diagram of the governor logic of FIG. 1 in accordance with some embodiments.

FIG. 3A is a block diagram of governor logic 300 that is one embodiment of governor logic 120 of FIG. 1. For the exemplary embodiment of FIG. 3A, governor logic 300 is shown to include a parser circuit 310, a profile table 320, and compare logic 330. Parser circuit 310 includes an input to receive the search request (SRCH_RQST), and is configured to extract the search key (SK) and the profile ID (PFL_ID) from the search request. For some embodiments, the search key is provided to the CAM blocks 102 via the block selection controller 110, as depicted in FIG. 3A. For other embodiments, the search key is provided directly from the parser circuit 310 to the CAM blocks 102 via a comparand bus (CBUS). The profile ID, which includes information indicating which of the CAM blocks 102(1)-102(n) of FIG. 1 are requested for the search operation, is provided as a look-up value to the profile table 320.

The profile table 320 stores a plurality of search profiles, and is configured to select one of the stored search profiles (SRCH_PFL) in response to the profile ID provided by the parser circuit 310. The search profile selected by the profile ID is forwarded from the profile table 320 to the CAM block selection controller 110 and to compare logic 330. Each of the search profiles stored in the profile table indicates which of the CAM blocks 102(1)-102(n) are to be selected for the requested search operation (e.g., and thus how many of the CAM blocks 102 are requested for the search operation), and can be used to initiate different types of search operations that require only a subset of the total number of available CAM blocks 102.

For example, in some embodiments, forwarding (e.g., next-hop routing) information can be stored in a first group of the CAM blocks 102, classification information (e.g., layer 2 and layer 3 classification values) can be stored in a second group of the CAM blocks 102, and media access control (MAC) information can be stored in a third group of the CAM blocks 102. For such embodiments, a first set of the search profiles used for forwarding look-up operations can include information that selects different numbers of the first group of CAM blocks 102, a second set of the search profiles used for classification operations can include information that selects different numbers of the second group of CAM blocks 102, and a third set of the search profiles used for MAC look-up operations can include information that selects different numbers of the third group of CAM blocks 102. For some of such embodiments, different groups of the CAM blocks can be concurrently searched, for example, as described in commonly owned U.S. Pat. No. 6,744,652, which is hereby incorporated by reference.

Compare logic 330 includes a first input to receive the selected search profile, a second input to receive the block limit value from configuration memory 130, a first output to generate the ACK/ERROR signal, and a second output to generate the search enable signal (SRCH_EN) that is provided to block selection controller 110. During requested search operations, compare logic 330 receives the selected search profile and compares the number of requested CAM blocks 102 as indicated therein with the value of BLK_LIM to generate the ACK/ERROR and SRCH_EN signals. Compare logic 330 can be any suitable circuit, logic element, or other component that can determine the number of requested CAM blocks 102 from the selected search profile and then compare that number with the block limit value provided by the configuration memory 130.

If the requested number of CAM blocks 102 is less than or equal to the block limit value, then compare logic 330 asserts the search enable signal (SRCH_EN) to allow the requested search operation to proceed, and asserts the ACK signal to indicate that the search request is granted. In response to the asserted state of SRCH_EN, the block selection controller 110 uses the selected search profile provided by the profile table 320 to selectively assert the block enable signals BLK_EN. More specifically, the block selection controller 110 asserts the block enable signals BLK_EN associated with the CAM blocks 102 requested by the search profile to enable those CAM blocks 102 to participate in the search operation, and de-asserts the block enable signals BLK_EN associated with the other (i.e., non-requested) CAM blocks 102 to prevent those CAM blocks 102 from participating in the search operation. As a result, only the CAM blocks 102 requested by the selected search profile participate in and consume power during the search operation, while the non-requested CAM blocks are not enabled and therefore do not consume power. In this manner, the specified power limit associated with the value of the BLK_LIM signals is not exceed during the search operation.

Conversely, if the requested number of CAM blocks 102 is greater than the block limit value, then compare logic 330 de-asserts SRCH_EN to prevent the search operation from being performed, and asserts the ERROR signal to indicate that the search request is denied. In response to the de-asserted state of SRCH_EN, the block selection controller 110 de-asserts all of the block enable signals (BLK_EN) to disable all CAM blocks 102(1)-102(n) so that no search operation is performed in the CAM blocks 102, thereby ensuring that the specified power limit is not exceeded (e.g., by rejecting the search operation that would have consumed more power than the specified power limit).

Figure 3B:
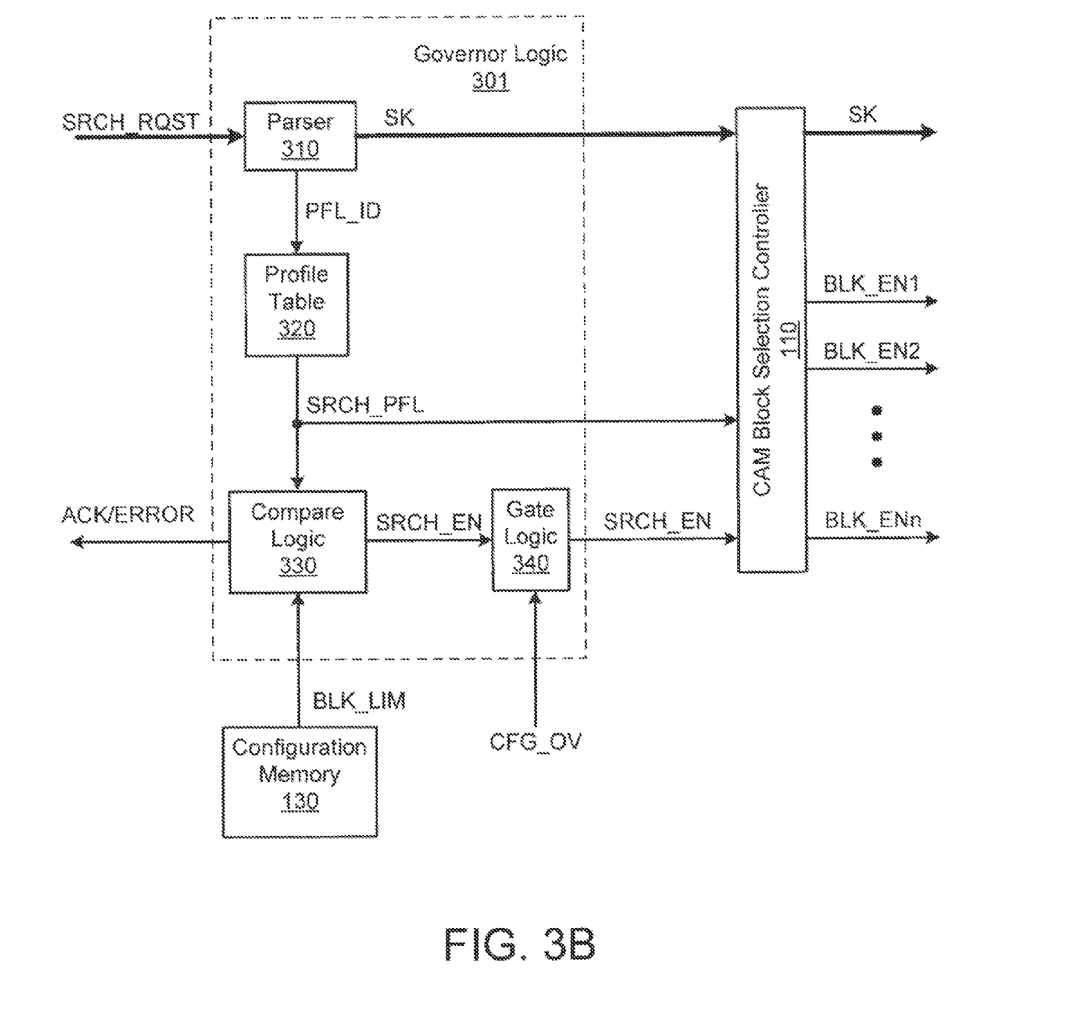
FIG. 3B is a block diagram of the governor logic of FIG. 1 in accordance with other embodiments.

FIG. 3B is a block diagram of governor logic 301 that is another embodiment of governor logic 120 of FIG. 1. Governor logic 301 is similar to governor logic 300 of FIG. 3A, with the addition of a gate logic 340 having a first input to receive SRCH_EN from compare circuit 330, a second input to receive the configuration override signal CFG_OV, and an output to provide SRCH_EN to the block selection controller 110. During requested search operations, if CFG_OV is de-asserted to indicate no override of the block limit value, governor logic 301 operates in the same manner as described above with respect to governor logic 300 of FIG. 3A. However, if CFG_OV is asserted to indicate on override mode, then gate logic 340 asserts SRCH_EN regardless of whether the request search operation exceeds the specified power limit, thereby allowing the requested search operation to proceed in the requested CAM blocks 102. In this manner, asserting CFG_OV (e.g., to logic high) allows the customer to dynamically override power limit constraints to selectively allow requested search operations to be preformed in the content search system 100 regardless of power consumption concerns. This may be useful in situations where performing a requested search operation is more important than observing predetermined power consumption limits.

Figure 4A:
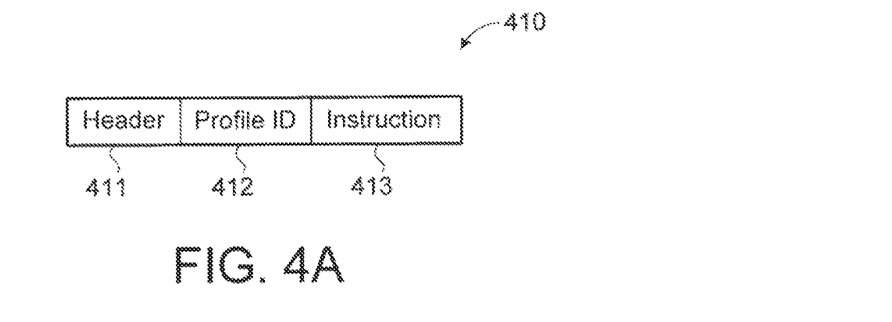
FIG. 4A depicts an exemplary search request in accordance with some embodiments.

FIG. 4A shows an exemplary search request 410 that includes a header 411, a profile ID 412, and an associated instruction 413. The header 411 can include packet header fields (e.g., a source address, a destination address, a source port ID, a destination port ID, and protocol information) from which a corresponding search key can be constructed by the parser circuit 310 in response to the instruction 413. The profile ID, which includes information indicating which and how many of the CAM blocks 102(1)-102(n) are requested for the search operation, identifies one of the search profiles stored in the profile table 320 that will be used to select one or more of the CAM blocks 102 for the requested search operation. Although not illustrated for simplicity, the instruction 413 extracted from the search request by parser circuit 310 can be used to control various circuit and timing elements within the CAM device.

Figure 4B:
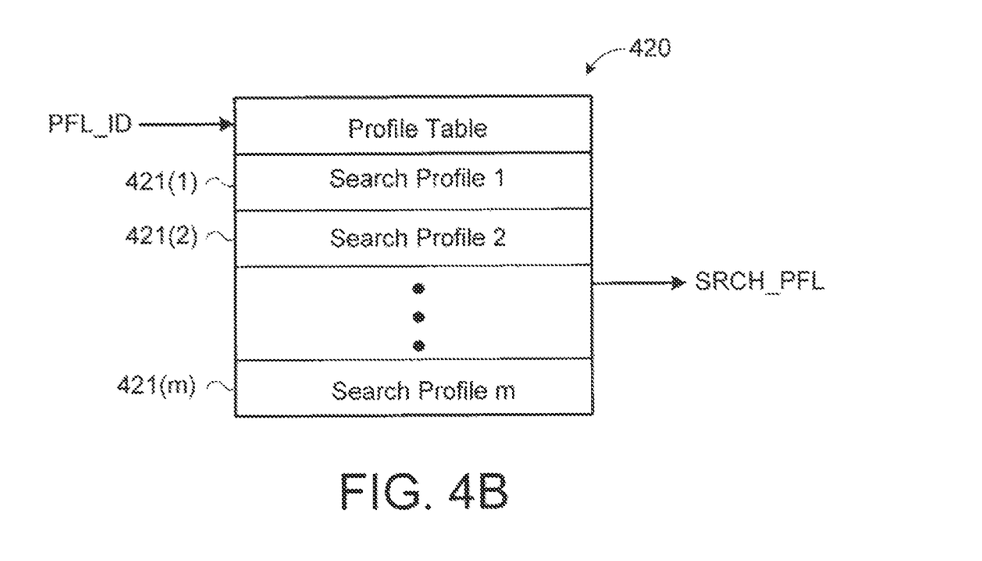
FIG. 4B depicts an exemplary embodiment of the search profile table of FIG. 3.

FIG. 4B shows a profile table 420 that is one embodiment of the profile table 320 of FIG. 3. The profile table 420 includes a plurality of storage locations 421(1)-421(m), each for storing an associated search profile. The search profiles, which can be predetermined profiles that are loaded into the profile table 420 prior to operation of the content search system 100, indicate which of CAM blocks 102(1)-102(n) are to be selected (e.g., enabled) for a corresponding search request. For one embodiment, profile table 420 stores 32 different search profiles, each of which selects a different combination of the CAM blocks 102 for a corresponding requested search operation. Referring also to FIG. 3A, profile table 420 uses the profile ID provided by parser circuit 310 to select one of the search profiles stored in a corresponding storage location 421, and provides the selected search profile to the compare logic 330 and to the block selection controller 110. Thus, for some embodiments, the profile ID is used to address a storage location 421 that contains a corresponding search profile. As such, profile table 420 can be any suitable addressable memory element or register. For example, in some embodiments, profile table 420 can be a logical table register (LTR).

Figure 4C:
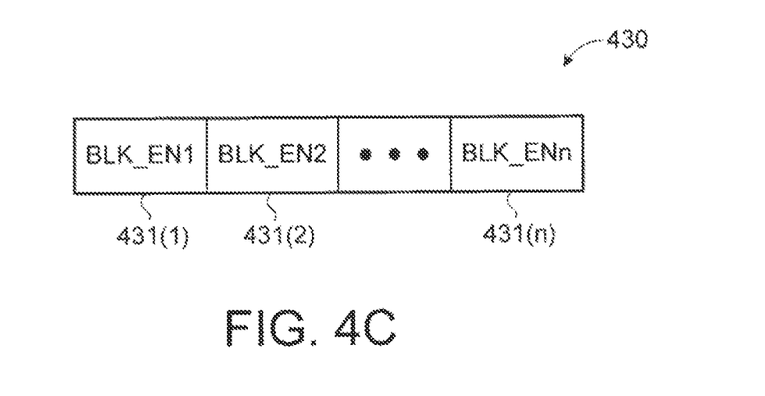
FIG. 4C depicts an exemplary search profile stored in the search profile table of FIG. 4B in accordance with some embodiments.

FIG. 4C depicts an exemplary search profile 430 stored in the search profile table 420 of FIG. 4B in accordance with some embodiments. The search profile 430 is shown to include a plurality of fields 431(1)-431(n) for storing a plurality of corresponding block enable signals BLK_EN1 to BLK_ENn, respectively. For some embodiments, when the profile table 420 forwards the selected search profile 430 to the block selection controller 110 for a granted search request, the block selection controller 110 uses the block enable signals provided in the search profile 430 as the block enable signals BLK_EN1 to BLK_ENn that selectively enable CAM blocks 102(1)-102(n), respectively. In this manner, the block selection controller 110 maps the enable signals provided in the selected search profile to the CAM blocks 102 to enable the requested CAM blocks 102 and to disable the non-requested CAM blocks 102. Further, for embodiments that use the exemplary search profile 430, the compare logic 330 (see also FIG. 3A) can determine the number of requested CAM blocks 102 by counting the number of asserted (e.g., logic high) enable signals stored in the fields 431 of the search profile 430. Further, although depicted in FIG. 4C as including only fields 431 for storing block enable signals, the search profile 430 can include other fields to store additional information associated with performing the associated requested search operation. Of course, for other embodiments, other search profile structures can be used.

Figure 5A:
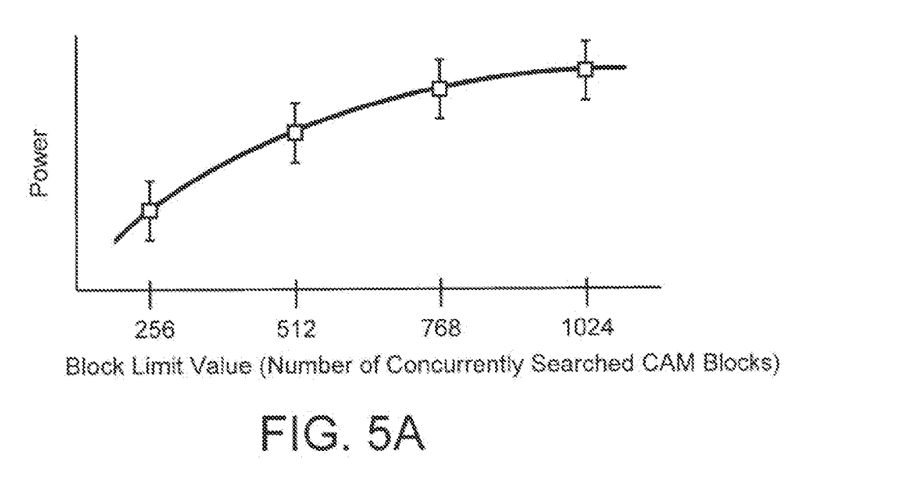
FIG. 5A is a graph of power dissipation as a function of the number of enabled CAM blocks, showing a non-linear relationship, in accordance with one embodiment.

FIG. 5A is a graph of power dissipation as a function of the block limit value, showing a non-linear relationship. In the example shown, as the number of concurrently searched CAM block increases (e.g. from 256 to 512, to 768, to 1024), so does the power dissipation, and in a non-linear fashion. In some cases, the power dissipation as a function of the block limit can be determined in simulation within an error band, the error band representative of a range between minimum power and maximum power. In other situations, the power dissipation as a function of the block limit can be determined in actual operation within an error band. Further, the error band might be expanded to account for the statistical likelihood that one or more CAM blocks might be deemed defective upon performing defect testing.

Figure 5B:
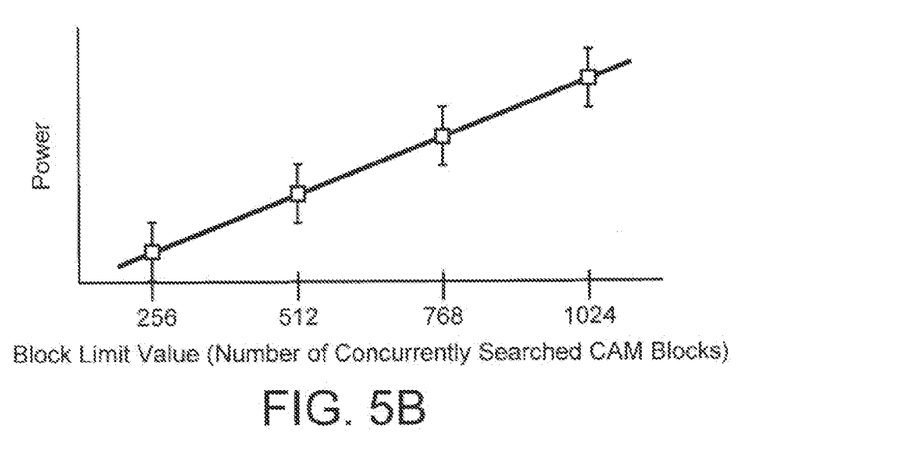
FIG. 5B is a graph of power dissipation as a function of the number of enabled CAM blocks, showing a linear relationship, in accordance with one embodiment.

FIG. 5B is a graph of power dissipation as a function of the block limit value, showing a linear relationship. In the example shown, as the number of concurrently searched CAM blocks increases (e.g. from 256 to 512, to 768, to 1024) so does the power dissipation, and in a linear fashion.

Figure 5C:
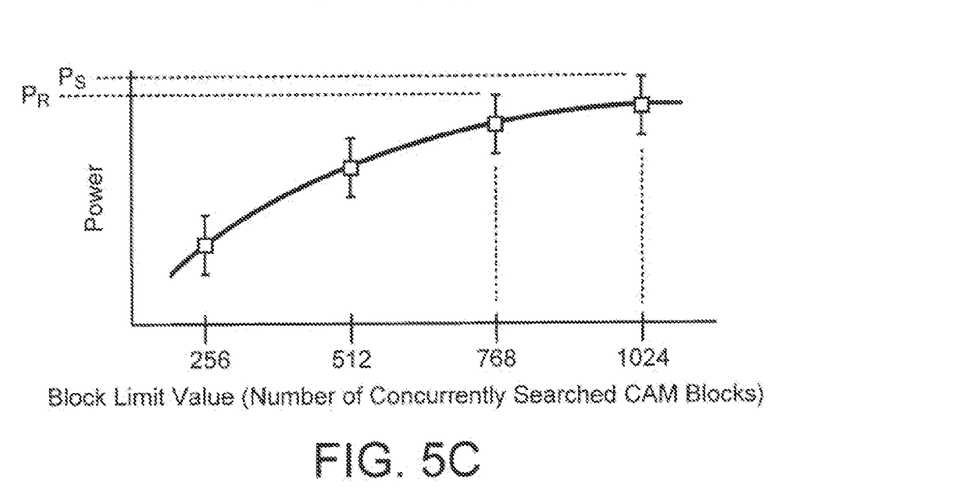
FIG. 5C is a graph of power dissipation as a function of the number of enabled CAM blocks, showing specific power configuration points, in accordance with one embodiment.

FIG. 5C is a graph of power dissipation as a function of the block limit value, showing specific power limit configuration points (e.g. $P_s$, $P_r$). Regardless of the specific shape of the relationship (i.e. linear or non-linear), a maximum power characterization can be determined from a graph of the form of FIG. 5C, and such a maximum power characterization can be used in characterizing and/or pricing of a content search system 100.

Figure 6:
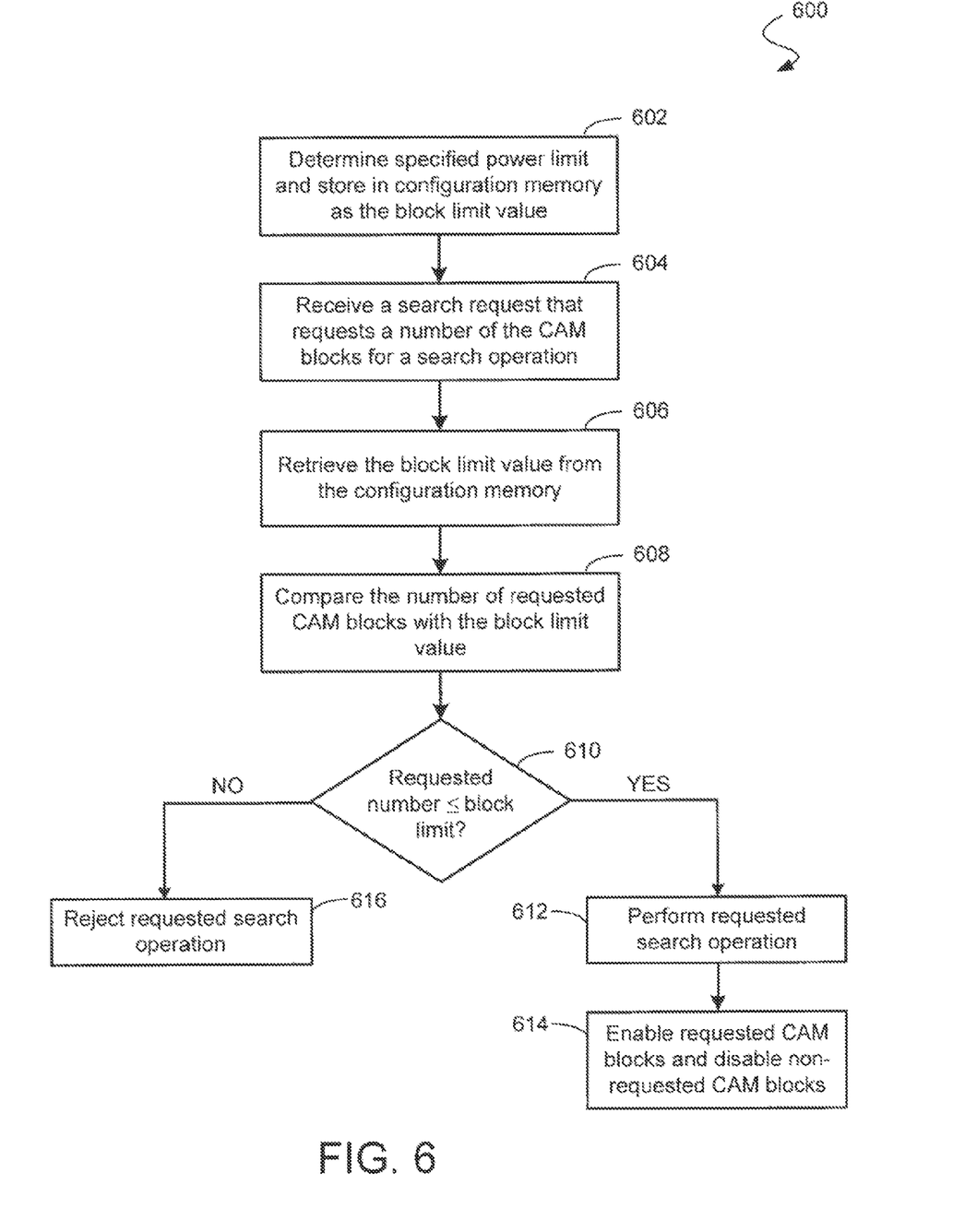
FIG. 6 is an illustrative flowchart depicting an operation for maintaining the power consumption of content search system 100 below a specified power limit, in accordance with some embodiments.

FIG. 6 is an illustrative flowchart depicting an exemplary operation for maintaining power consumption of content search system 100 below a specified power limit. First, a specified power limit is determined and then stored in the configuration memory 130 as a block limit value that indicates the maximum number of the CAM blocks 120 that can be concurrently searched without exceeding the specified power limit (602). Then, a search request is received that requests a number of the CAM blocks 102 for a search operation in the content search system (604). The block limit value is retrieved from the configuration memory 130 (606), and then compared with the number of requested CAM blocks 102 (608). Then, if the requested number of CAM blocks is less than or equal to the block limit value, as tested at 610, the request search operation is performed and the ACK signal is asserted to indicate the search request is granted (612). For the requested search operation, the block selection controller 110 enables the requested CAM blocks 102 and disables the non-requested CAM blocks 102 using the block enable signals, as described above (614).

Conversely, if the requested number of CAM blocks is greater than the block limit value, as tested at 610, the request search operation is rejected and the ERROR signal is asserted to indicate the rejection of the search request (616).

Figure 7:
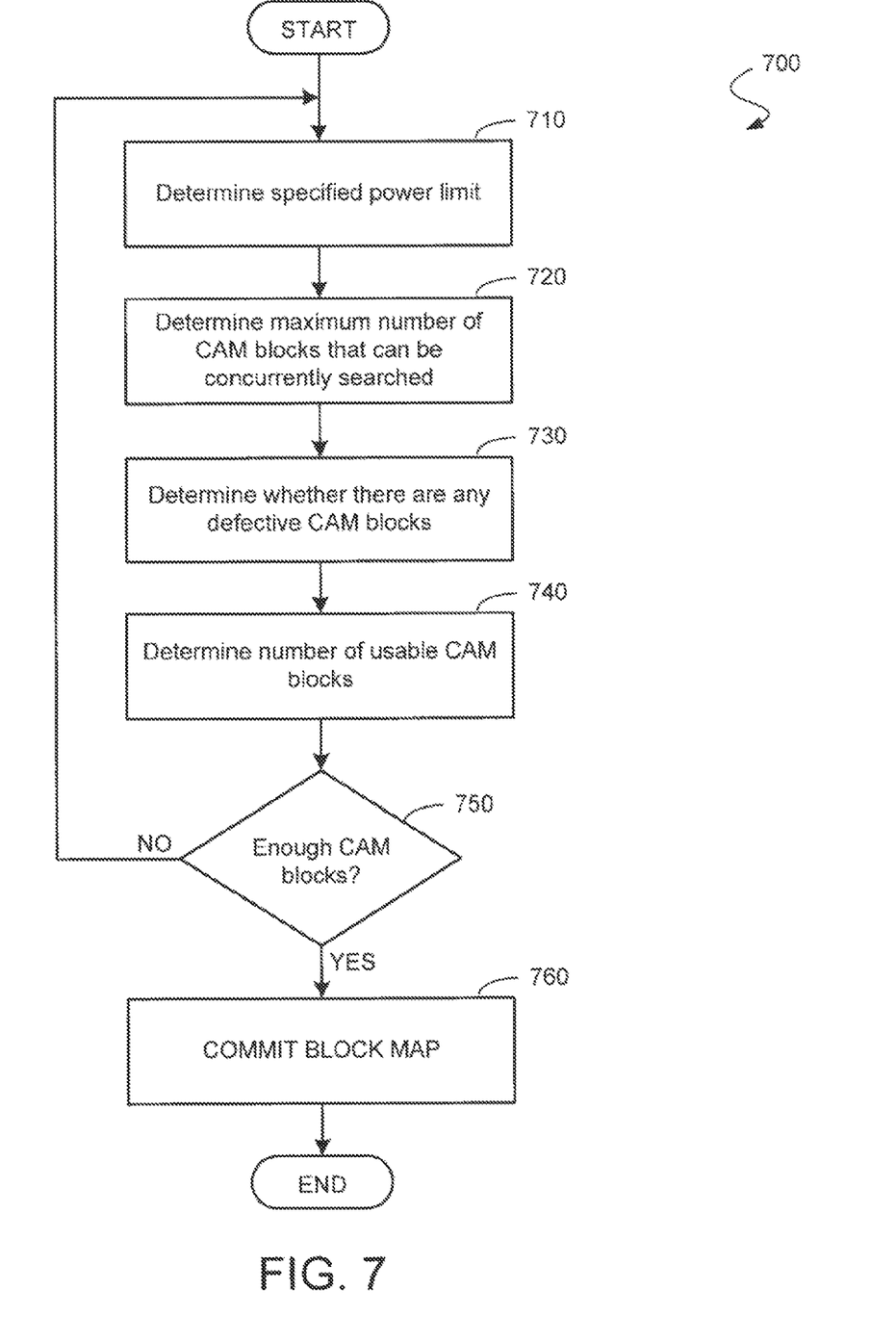
FIG. 7 is a flowchart of one embodiment of a method for committing a block map, in accordance with some embodiments.

FIG. 7 is a flowchart of a method 700 for defining a fuse map. As earlier indicated, the ability to selectively enable or disable one or more CAM blocks from participating in search operations may be especially useful for creating different product configurations based on a single device, and/or for disabling defective blocks. Selectively enabling a limited number of CAM blocks 102 for creating specific product configurations can include combining defective block lists with block limits. For example, in one embodiment, a content search system with 128 CAM blocks, 8 of which are deemed defective, can be used in a limited configuration having (at most) 120 enabled CAM blocks (i.e. 128 less the 8 blocks that are deemed defective). In order to combine defective block lists with block limit values, the block limits are applied to the non-defective blocks. Method 600 depicts a method for defining a fuse map by combining defective block lists with block limit values. Such a fuse map (e.g. a binary representation in a computer memory) can then be stored in a fuse array that serves as one embodiment of the configuration memory 130 (see also FIG. 1).

The method commences by determining a maximum specified power limit (e.g., $P_s$, $P_r$) based on commercial influences, on an application-specific limit, or other suitable criteria (step 710). Using the specified power limit, and using a power characterization of the form shown and described above in FIGS. 5A-5C, the maximum number of CAM blocks 102 that can be concurrently enabled for a search operation without exceeding the specified power limit can be determined (step 720).

To determine whether any of the CAM blocks 102 are defective (step 730), each CAM block 102 within the search system 100 can be tested in a suitable manner to determine whether it is, or is not, a defective block. If a CAM block 102 is defective, the defective nature of the CAM block can be determined at step 730, even if the actual testing were performed in a different step. Otherwise, if the CAM block 102 is not defective, the non-defective nature of the CAM block can also be determined at step 730. Each CAM block 102 can be individually addressed and tested.

The total number of CAM blocks 102 in the system 100 is reduced by the number of defective CAM blocks 102 to calculate the number of usable blocks (step 740). If the total number of usable blocks is less than the maximum number of CAM blocks as determined in step 720, then a different power limit is selected (step 710). On the other hand, if the total number of usable blocks is equal to or greater than the maximum number of CAM blocks as determined in step 720, then the configuration determined in step 710 is feasible, and a block map can be committed (step 760). In some embodiments, the block map committed in step 760 enables all non-defective blocks. In other embodiments, the block map committed in step 760 disables defective blocks and further disables non-defective blocks such that the block map enables only the maximum number of blocks determined in step 720. The acts performed in committing the block map can include "blowing" fuses in a fuse array, or it can include performing some input/output operation, such as PIO (e.g. between a content search system 100 and its environment), or it can include storing a block map representation in volatile or non-volatile memory, etc. The results of the commit block map step 760 (e.g. a block map representation) can be stored in the configuration memory 130 of FIG. 1.

In some embodiments, the method for managing a power dissipation limit 700 can be performed in its entirety at least as fast as the rate of arrival of requested search profiles, thus the method for managing a power dissipation limit 700 can respond dynamically to a change in configuration.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure. Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages.

What is claimed is:

1. A content search system for maintaining its power consumption below a specified power limit, comprising:
    a plurality of content addressable memory (CAM) blocks, each CAM block from among the plurality of CAM blocks having an array of CAM cells; and
    a configuration memory that stores:
        a block limit value indicating a maximum number of the plurality of CAM blocks that can be concurrently searched without exceeding the specified power limit;
        a list of CAM blocks of the plurality of CAM blocks that are defective; and
        a block map that disables the listed CAM blocks that are defective based on the block limit value.

2. The content search system of claim 1, further comprising:
    governor logic, coupled to the plurality of CAM blocks and to the configuration memory, the governor logic configured to allow a search operation to be performed in a requested number of the plurality of CAM blocks only if the requested number is less than or equal to the block limit value.

3. The content search system of claim 2, wherein the governor logic is further configured to reject the search operation if the requested number of the plurality of CAM blocks is greater than the block limit value.

4. The content search system of claim 2, wherein the governor logic is further configured to receive a search request indicating the requested number of the plurality of CAM blocks for the search operation.

5. The content search system of claim 1, wherein the configuration memory comprises a non-volatile read-only memory.

6. The content search system of claim 1, wherein the configuration memory comprises a fuse bank.

7. The content search system of claim 1, wherein the block limit value is determined during simulation or testing of the content search system.

8. The content search system of claim 2, further comprising:
    a block selection controller, coupled to the governor logic, configured to:
        selectively enable the requested number of the plurality of CAM blocks, and
        disable a non-requested number of the plurality of CAM blocks during the search operation.

9. The content search system of claim 8, wherein the block selection controller is configured to disable all of the plurality of CAM blocks if the requested number of the plurality of CAM blocks is greater than the block limit value.

10. The content search system of claim 2, wherein the governor logic comprises:
    a parser circuit configured to receive a search request to extract a search key and a search profile identification (ID) from the search request;
    a profile table configured to select, in response to the extracted search profile ID, one of a plurality of search profiles stored therein; and
    compare logic configured to compare the selected search profile with the block limit value to generate a search enable signal that selectively enables the search operation to be performed.

11. The content search system of claim 10, wherein the selected search profile is configured to indicate which of the plurality of CAM blocks are requested for the search operation.

12. The content search system of claim 10, further comprising:
    a block selection controller configured to:
        receive the selected search profile and the search enable signal, and
        generate a plurality of block enable signals, each of which selectively enables a corresponding one of the plurality of CAM blocks for the search operation.

13. The content search system of claim 12, wherein the block selection controller is further configured to selectively assert the plurality of block enable signals in response to the selected search profile.

14. The content search system of claim 12, wherein the block selection controller is further configured to de-assert all of the plurality of block enable signals to disable all corresponding CAM blocks of the plurality of CAM blocks if the search enable signal is de-asserted.

15. A content search system for maintaining its power consumption below a specified power limit during a search operation, comprising:
    a plurality of content addressable memory (CAM) blocks, each CAM block from among the plurality of CAM blocks having an array of CAM cells;
    governor logic configured to:
        receive a block limit value indicating a maximum number of CAM blocks from among the plurality of CAM blocks that can be concurrently searched without exceeding the specified power limit and a search request that requests a number of the CAM blocks for the search operation, and
        generate a search enable signal; and
    a configuration memory that stores:
        a list of CAM blocks of the plurality of CAM blocks that are defective; and
        a block map that disables the listed CAM blocks based on the block limit value.

16. The content search system of claim 15, further comprising:
a block selection controller configured to:
receive the search enable signal and information associated with the search request, and
generate a plurality of block enable signals, each of the plurality of block enable signals selectively enabling a corresponding one of the plurality of CAM blocks for the search operation.

17. The content search system of claim 15, wherein the governor logic is further configured to assert the search enable signal to allow the search operation to be performed in the requested number of the CAM blocks only if the requested number of the CAM blocks is less than or equal to the block limit value.

18. The content search system of claim 16, wherein the block selection controller is further configured to selectively assert the plurality of block enable signals to enable only the requested number of the CAM blocks when the search enable signal is asserted.

19. The content search system of claim 15, wherein the governor logic is further configured to de-assert the search enable signal to prevent the search operation from being performed if the requested number of the CAM blocks is greater than the block limit value.

20. The content search system of claim 18, wherein the block selection controller is further configured to de-assert the plurality of block enable signals to disable search of the CAM blocks when the search enable signal is de-asserted.

* * * * *